United States Patent
Ota et al.

(10) Patent No.: US 9,184,229 B2
(45) Date of Patent: Nov. 10, 2015

(54) SEMICONDUCTOR DEVICE AND METHOD FOR MANUFACTURING SAME

(71) Applicant: Kabushiki Kaisha Toshiba, Tokyo (JP)

(72) Inventors: Chiharu Ota, Kanagawa-ken (JP); Johji Nishio, Tokyo (JP); Kazuto Takao, Ibaraki-ken (JP); Takashi Shinohe, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/790,282

(22) Filed: Mar. 8, 2013

(65) Prior Publication Data

US 2014/0034965 A1  Feb. 6, 2014

(30) Foreign Application Priority Data

Jul. 31, 2012  (JP) ................................. 2012-170278

(51) Int. Cl.
*H01L 29/792* (2006.01)
*H01L 29/15* (2006.01)
(Continued)

(52) U.S. Cl.
CPC ........ *H01L 29/0615* (2013.01); *H01L 21/0257* (2013.01); *H01L 29/161* (2013.01); *H01L 29/165* (2013.01); *H01L 29/167* (2013.01); *H01L 29/6606* (2013.01); *H01L 29/7395* (2013.01); *H01L 29/7802* (2013.01); *H01L 29/8613* (2013.01); *H01L 29/872* (2013.01); *H01L 29/0638* (2013.01); *H01L 29/1608* (2013.01)

(58) Field of Classification Search
CPC .............. H01L 29/045; H01L 29/7842; H01L 29/267H01L 29/66068; H01L 29/7802; H01L ; 29/7813; H01L 29/1608; H01L 21/0445; H01L 21/046; H01L 21/04; H01L 29/0615; H01L 21/0257
USPC ...................... 257/77, 66, E21.054, E21.057, 257/E21.059, E21.066, E29.004, E29.081, 257/E29.104, E29.257; 438/285, 508
See application file for complete search history.

(56) References Cited

U.S. PATENT DOCUMENTS

2004/0183080 A1* 9/2004 Kusumoto et al. .............. 257/77
2008/0280412 A1* 11/2008 Tsuji ............................. 438/285
(Continued)

FOREIGN PATENT DOCUMENTS

JP  2005-244180 A   9/2005
JP  2009-64970      3/2009

OTHER PUBLICATIONS

Office Action issued Jun. 13, 2014 in Japanese Patent Application No. 2013-098662 (with English translation).

*Primary Examiner* — Julio J Maldonado
*Assistant Examiner* — Moazzam Hossain
(74) *Attorney, Agent, or Firm* — Oblon, McClelland, Maier & Neustadt, L.L.P.

(57) ABSTRACT

According to one embodiment, a semiconductor device, includes: a first semiconductor region of a first conductivity type; a second semiconductor region provided on the first semiconductor region, an impurity concentration of the second semiconductor region being lower than an impurity concentration of the first semiconductor region; a third semiconductor region of a second conductivity type provided on the second semiconductor region; and a fourth semiconductor region provided on the third semiconductor region or in a portion of the third semiconductor region. A lattice strain of the fourth semiconductor region is greater than a lattice strain of the third semiconductor region.

15 Claims, 6 Drawing Sheets

(51) Int. Cl.
*H01L 29/06* (2006.01)
*H01L 21/02* (2006.01)
*H01L 29/872* (2006.01)
*H01L 29/66* (2006.01)
*H01L 29/739* (2006.01)
*H01L 29/78* (2006.01)
*H01L 29/861* (2006.01)
*H01L 29/161* (2006.01)
*H01L 29/165* (2006.01)
*H01L 29/167* (2006.01)
*H01L 29/16* (2006.01)

(56) References Cited

U.S. PATENT DOCUMENTS

| | | | |
|---|---|---|---|
| 2010/0032791 A1* | 2/2010 | Hozumi et al. | 257/493 |
| 2012/0061686 A1* | 3/2012 | Nishiguchi et al. | 257/77 |
| 2013/0032822 A1* | 2/2013 | Ishibashi | 257/77 |
| 2013/0126906 A1* | 5/2013 | Tomita et al. | 257/77 |
| 2013/0178024 A1* | 7/2013 | Flachowsky et al. | 438/199 |
| 2013/0214291 A1* | 8/2013 | Uchida et al. | 257/77 |

\* cited by examiner

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2012-170278, filed on Jul. 31, 2012; the entire contents of which are incorporated herein by reference.

FIELD

Embodiments described herein relate generally to a semiconductor device and a method for manufacturing same.

BACKGROUND

Device structures and device materials to realize low-loss semiconductor devices are desirable. By using, for example, silicon carbide (SiC) as the material, it is possible to design with a lower on-resistance and a higher breakdown voltage than when silicon (Si) is used. There are cases where dislocations called basal plane dislocations (BPDs) exist inside the semiconductor substrate. It is known that the dislocations extend during the device operation particularly in a bipolar mode; characteristic fluctuation of the device occurs; and the loss increases. Because the extension of the dislocations reduces the long-term reliability of the device, it is necessary to suppress the characteristic fluctuation of the semiconductor device recited above.

DETAILED DESCRIPTION

Figure 1:
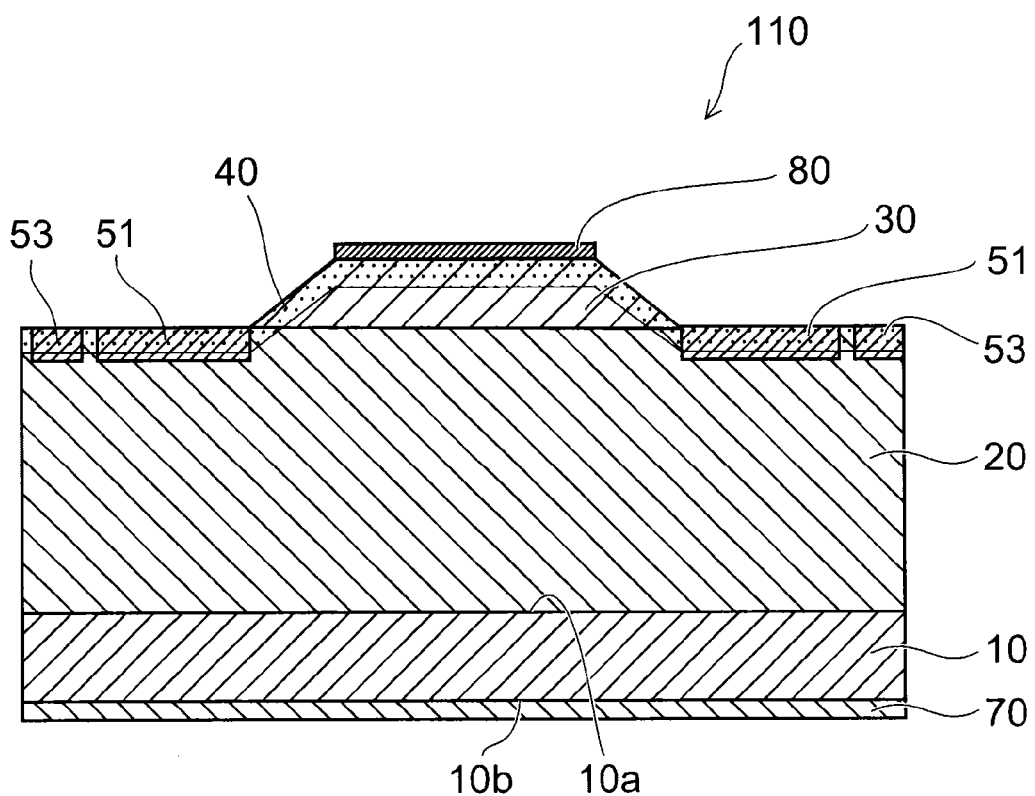
FIG. 1 is a schematic cross-sectional view showing a configuration of a semiconductor device according to a first embodiment.

In general, according to one embodiment, a semiconductor device includes: a first semiconductor region of a first conductivity type; a second semiconductor region provided on the first semiconductor region, an impurity concentration of the second semiconductor region being lower than an impurity concentration of the first semiconductor region; a third semiconductor region of a second conductivity type provided on the second semiconductor region; and a fourth semiconductor region provided on the third semiconductor region or in a portion of the third semiconductor region, a lattice strain of the fourth semiconductor region being greater than a lattice strain of the third semiconductor region.

In general, according to another embodiment, a method for manufacturing a semiconductor device is provided. The method includes: forming a second semiconductor region on a first semiconductor region of a first conductivity type, an impurity concentration of the second semiconductor region being lower than an impurity concentration of the first semiconductor region; forming a third semiconductor region of a second conductivity type on the second semiconductor region; and forming a fourth semiconductor region by performing ion implantation into the third semiconductor region, a lattice strain of the fourth semiconductor region being greater than a lattice strain of the third semiconductor region.

Embodiments of the invention will now be described based on the drawings.

The drawings are schematic or conceptual; and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

In the description hereinbelow, specific examples are illustrated in which the first conductivity type is an n type and the second conductivity type is a p type.

In the description hereinbelow, the notations of $n^+$, $n$, $n^-$, $p^+$, $p$, and $p$ indicate relative degrees of the impurity concentration of each of the conductivity types. In other words, $n^+$ is an n-type impurity concentration relatively higher than n; and $n^-$ is an n-type impurity concentration relatively lower than n. Also, $p^+$ is a p-type impurity concentration relatively higher than p; and $p^-$ is a p-type impurity concentration relatively lower than p.

First Embodiment

FIG. 1 is a schematic cross-sectional view showing the configuration of the semiconductor device according to the first embodiment.

As shown in FIG. 1, the semiconductor device 110 according to the first embodiment includes a substrate 10 which is a first semiconductor region, a first epitaxial layer 20 which is a second semiconductor region, a second epitaxial layer 30 which is a third semiconductor region, and a defect suppression layer 40 which is a fourth semiconductor region. The semiconductor device 110 further includes a cathode electrode 70 which is a first electrode and an anode electrode 80 which is a second electrode.

Such a semiconductor device 110 is, for example, a PiN diode.

The substrate 10 is an $n^+$-type semiconductor region. The substrate 10 includes, for example, $n^+$-type SiC. In the embodiment, hexagonal SiC (e.g., 4H—SiC) is included in the substrate 10. The substrate 10 is, for example, a SiC bulk substrate made by sublimation.

The substrate 10 has a first surface 10a. The first surface 10a of the substrate 10 is the front surface of a wafer including SiC. The first surface 10a also is an interface between the substrate 10 and the first epitaxial layer 20. In the embodiment, the first surface 10a of the substrate 10 is tilted more than 0 degrees and not more than 8 degrees with respect to the (0001) plane which is the hexagonal SiC surface. For example, the substrate 10 is a misoriented substrate such as a 2 degree misoriented substrate, a 4 degree misoriented substrate, an 8 degree misoriented substrate, etc. Here, the front surface of the substrate 10 of SiC may be a Si surface or a C surface. Basal plane dislocations, which exist inside the basal plane of the substrate 10, exist in the interior of the substrate 10 that is the misoriented substrate.

An n-type impurity is doped into the substrate 10; and the impurity concentration of the n-type impurity is, for example, not less than $1×10^{18}$ cm$^{-3}$ and not more than $1×10^{20}$ cm$^{-3}$. In the embodiment, the impurity concentration is about $5×10^{18}$ cm$^{-3}$.

The first epitaxial layer 20 is an n$^-$-type semiconductor region. The first epitaxial layer 20 is a semiconductor region that includes n$^-$-type SiC. The first epitaxial layer 20 is formed on the first surface 10a of the substrate 10 and has a crystal structure that is equivalent to that of the substrate.

The thickness of the first epitaxial layer 20 is determined by the design of the breakdown voltage characteristic and other characteristics of the semiconductor device 110 and is, for example, not more than about 200 micrometers (μm). An n-type impurity is doped into the first epitaxial layer 20; and the impurity concentration of the n-type impurity is lower than the impurity concentration of the substrate 10. The impurity concentration of the first epitaxial layer 20 is, for example, not less than $8×10^{14}$ cm$^{-3}$ and not more than $1×10^{17}$ cm$^{-3}$.

The second epitaxial layer 30 is a p$^+$-type semiconductor region. The second epitaxial layer 30 is a semiconductor region made of p$^+$-type SiC. The second epitaxial layer 30 is formed on the first epitaxial layer 20.

The thickness of the second epitaxial layer 30 is, for example, about several μm. A p-type impurity is doped into the second epitaxial layer 30; and the impurity concentration of the p-type impurity is, for example, not less than $1×10^{16}$ cm$^{-3}$ and not more than $5×10^{19}$ cm$^{-3}$.

The impurity concentration of the second epitaxial layer 30 may change in the thickness direction. For example, the impurity concentration of the front surface (the surface of the second epitaxial layer 30 on the side opposite to the first epitaxial layer 20) portion of the second epitaxial layer 30 may be highest; and the impurity concentration of the portion of the surface of the second epitaxial layer 30 on the first epitaxial layer 20 side may be lowest.

For example, the impurity concentration of the front surface portion of the second epitaxial layer 30 is set to be not less than $1×10^{15}$ cm$^{-3}$ and not more than $2×10^{19}$ cm$^{-3}$; and the impurity concentration of the portion of the surface of the second epitaxial layer 30 on the first epitaxial layer 20 side is set to be not less than $1×10^{18}$ cm$^{-3}$ and not more than $1×10^{21}$ cm$^{-3}$. The change of the impurity concentration may be in stages or continuous. Providing such a change of the impurity concentration achieves both a higher breakdown voltage in the reverse direction due to the enlargement of the spreading portion of the depletion layer and a low contact resistance at the ohmic connection between the second epitaxial layer 30 and the anode electrode 80.

The second epitaxial layer 30 is provided, for example, on a portion of the first epitaxial layer 20. In other words, the second epitaxial layer 30 is formed in a mesa shape.

The impurity concentration of the first epitaxial layer 20 on the second epitaxial layer 30 side (the pn junction interface side) may be set to be higher than the impurity concentration on the substrate 10 side. Thereby, the electric field when applying the reverse voltage is concentrated not at the peripheral portion but at the element central portion (the active region portion); and the local electric field concentration due to the unbalance of the structure at the peripheral portion is relaxed. As a result, the reliability of the device increases.

The defect suppression layer 40 is provided on the second epitaxial layer 30. The defect suppression layer 40 is a p-type semiconductor region and may be provided in a portion of the second epitaxial layer 30. The defect suppression layer 40 has a lattice strain that is greater than the lattice strain of the second epitaxial layer 30. The defect suppression layer 40 includes an impurity that is different from the impurity included in the second epitaxial layer 30. The impurity included in the defect suppression layer 40 may include not only a conductive impurity but also an inert element. In the case where the host semiconductor of the defect suppression layer 40 is SiC, the impurity included in the defect suppression layer 40 is, for example, argon (Ar), silicon (Si), carbon (C), etc.

The defect suppression layer 40 is formed by, for example, performing ion implantation into the front surface portion of the second epitaxial layer 30. In the case where ion implantation into the front surface portion of the second epitaxial layer 30 is performed, lattice strain occurs in the crystal of the second epitaxial layer 30. The lattice strain is the strain that occurs due to the tensile stress occurring due to many atoms entering the crystal. The portion where the lattice strain occurs is used as the defect suppression layer 40. In other words, the lattice strain of the defect suppression layer 40 is greater than the lattice strain of the second epitaxial layer 30.

Here, the lattice strain is measured by, for example, Raman spectroscopy and/or a TEM (Transmission Electron Microscope).

Thus, because the defect suppression layer 40 is a region formed by performing ion implantation into at least the second epitaxial layer 30, the impurity concentration of the defect suppression layer 40 is higher than the impurity concentration (in the case where multiple impurities are included, the total impurity concentration) of the second epitaxial layer 30. For example, the impurity concentration of the defect suppression layer 40 is higher than the impurity concentration of the second epitaxial layer 30 by a factor of 1000 or more. For example, although the impurity concentration of the second epitaxial layer 30 is not less than about $1×10^{16}$ cm$^{-3}$ and not more than about $5×10^{19}$ cm$^{-3}$, the impurity concentration of the defect suppression layer 40 is not less than about $5×10^{17}$ cm$^{-3}$ and not more than about $1×10^{21}$ cm$^{-3}$.

The defect suppression layer 40 may be provided from the region on the second epitaxial layer 30 to a region on the first epitaxial layer 20. The reliability of the semiconductor device 110 increases further by the defect suppression layer 40 being provided from the region on the second epitaxial layer 30 to a region on the first epitaxial layer 20. For example, the number of the basal planes appearing at the pn junction interface decreases as the off angle of the misoriented substrate decreases. However, even in the case where the basal plane is not exposed at the surface of the pn junction, the basal plane dislocations existing in the portion under the pn junction interface extend; and characteristic degradation occurs. Therefore, the extension of the basal plane dislocations is sufficiently suppressed even in the case where the off angle is small by providing the defect suppression layer 40 from the region on the second epitaxial layer 30 to a region on the first epitaxial layer 20 in a region that is as wide as possible.

A terminal structure region 51 is provided on the first epitaxial layer 20 around the second epitaxial layer 30 which is formed in the mesa shape. The terminal structure region 51 is provided, for example, to be continuous around the second epitaxial layer 30. A channel stopper layer 53 is provided on the first epitaxial layer 20 around the terminal structure region 51 to be separated from the terminal structure region 51. For example, the channel stopper layer 53 is provided around the terminal structure region 51.

The terminal structure region 51 is, for example, a p⁻-type semiconductor region. The terminal structure region 51 is, for example, a JTE (Junction Termination Extension). Other than a JTE, the terminal structure region 51 may be a RESURF layer, a FLR (Field Limiting Ring), or a FP (field plate). The terminal structure region 51 increases the breakdown voltage by relaxing the electric field concentration at the terminal portion during a reverse bias.

The cathode electrode 70 which is the first electrode is provided at a second major surface 10b on the side of the substrate 10 opposite to the first surface 10a. The cathode electrode 70 is electrically connected to the substrate 10. The cathode electrode 70 has an ohmic connection with the substrate 10. The anode electrode 80 which is the second electrode is provided on the defect suppression layer 40. The anode electrode 80 is electrically connected to the second epitaxial layer 30. The anode electrode 80 has ohmic connections with the defect suppression layer 40 and the second epitaxial layer 30.

In such a semiconductor device 110, the substrate 10 is the N (the n-type semiconductor region) of the PiN diode. The first epitaxial layer 20 is the i (the intrinsic semiconductor region) of the PiN diode. The second epitaxial layer 30 and the defect suppression layer 40 are the P (the p-type semiconductor region) of the PiN diode.

Operations of the semiconductor device 110 will now be described.

First, an operation of the semiconductor device 110 will be described in the case where a voltage (a forward voltage) is applied such that the anode electrode 80 is positive with respect to the cathode electrode 70. In the case where the forward voltage is applied, electrons and holes that exceed the built-in potential flow via the pn junction surface existing at the interface between the p⁺-type second epitaxial layer 30 and the n⁻-type first epitaxial layer 20. Thereby, the current flows in the semiconductor device 110 (the forward operation).

An operation of the semiconductor device 110 will now be described in the case where a voltage (a reverse voltage) is applied such that the anode electrode 80 is negative with respect to the cathode electrode 70. In the case where the reverse voltage is applied, the depletion layer spreads mainly on the i layer side of the pn junction surface; and a current substantially does not flow in the semiconductor device 110 (the reverse operation).

An operation will now be described in the case where the application of the forward voltage in the forward operation of the semiconductor device 110 is continued further. In the semiconductor device 110, the defect suppression layer 40 is provided on the second epitaxial layer 30. A region having lattice strain is included in the crystal interior of the defect suppression layer 40. By the defect suppression layer 40 having such a lattice strain, stress acts due to the lattice strain inside the crystal basal plane. Thereby, in the case where the application of the forward voltage is continued, the occurrence of stacking faults having starting points at the basal plane dislocations existing in the crystal basal plane (in the case of a hexagonal crystal, the (0001) plane for the Si surface and the (000-1) plane for the C surface, and in the case of a cubic crystal, the (111 plane)) is suppressed.

In the semiconductor device 110, the breakdown electric field strength and the increase of the on-voltage that occur in the case where the stacking faults occur is suppressed. Accordingly, in the semiconductor device 110, the increase of the on-voltage and the degradation of the breakdown voltage are suppressed over a long period of time.

Figure 2:
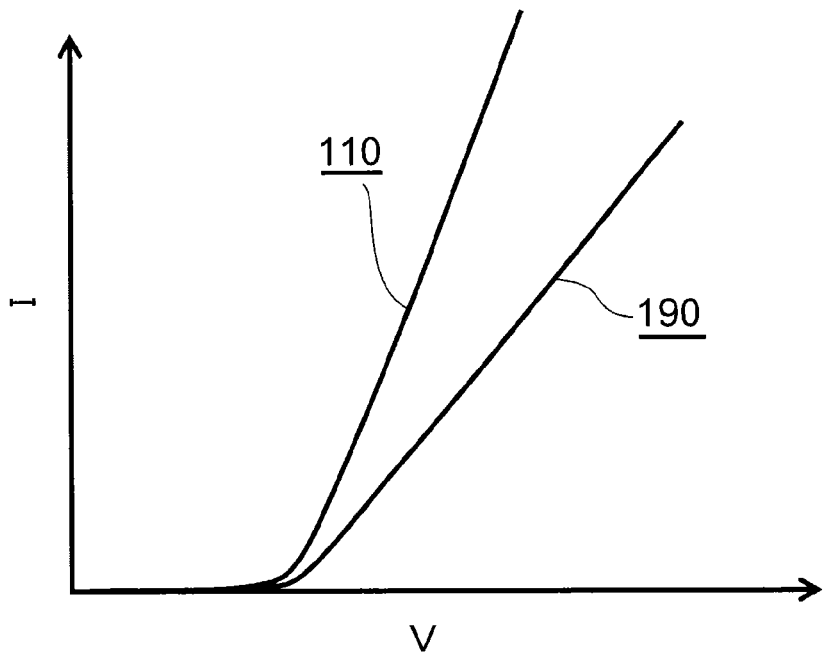
FIG. 2 shows a current-voltage characteristic of the semiconductor device.

FIG. 2 shows the current-voltage characteristic of the semiconductor device.

FIG. 2 shows the current (I)-voltage (V) characteristic of the semiconductor device 110 according to the embodiment and the I-V characteristic of a semiconductor device 190 according to a reference example.

The semiconductor device 190 according to the reference example does not include the defect suppression layer 40 of the semiconductor device 110 according to the embodiment. Otherwise, the configuration of the semiconductor device 190 is similar to that of the semiconductor device 110.

As shown in FIG. 2, the necessary voltage value to cause the current to flow can be lower for the semiconductor device 110 according to the embodiment than for the semiconductor device 190 according to the reference example. That is, the on-voltage is lower for the semiconductor device 110 than for the semiconductor device 190.

Dislocations called basal plane dislocations exist in the substrate 10 of the semiconductor devices 110 and 190. The dislocations extend during the device operation. This causes an increase of the on-voltage and/or degradation of the breakdown voltage.

It may be conjectured that this is due to the following mechanism. Crystal defects called basal plane dislocations that exist in the (0001) plane exist inside the substrate 10 in the case where a hexagonal crystal is used as the substrate 10 of SiC. In the case where epitaxial growth of SiC is performed on the substrate 10 of SiC, generally, the cut surface of the crystal is tilted several degrees from the (0001) plane; and step-flow growth is performed.

In such a case, the basal plane dislocations propagate from the first surface 10a of the substrate 10 of SiC into the epitaxial layers (the first epitaxial layer 20 and the second epitaxial layer 30) of the SiC. Further, when current stress is applied, the basal plane dislocations extend; and stacking faults occur. The stacking faults that occur become high-resistance regions and cause the forward characteristics of the element to degrade.

Particularly in the case of a high breakdown voltage device, the region where the stacking faults occur may easily become large because the layer that is epitaxial grown on the first surface 10a of the substrate 10 is thick. That is, it is considered that degradation of the forward characteristics markedly occurs in the high breakdown voltage device.

As in the embodiment, in the case where the defect suppression layer 40 is provided in the semiconductor device 110, the stress due to the lattice strain provided in the defect suppression layer 40 acts in the basal plane. Thereby, in the case where the application of the forward voltage is continued, the occurrence of the stacking faults having the basal plane dislocations existing in the crystal basal plane as starting points is suppressed. Accordingly, compared to the semiconductor device 190 which does not include the defect suppression layer 40, the occurrence of the stacking faults is suppressed and the on-voltage is reduced in the semiconductor device 110 which includes the defect suppression layer 40.

Because the defect suppression layer 40 suppresses the occurrence of the stacking faults having the basal plane dislocations as starting points, the defect suppression layer 40 may be provided at positions as necessary according to the positions and/or the density of the basal plane dislocations. For example, the defect suppression layer 40 may be provided at a portion, at the entirety, or at multiple locations of the first epitaxial layer 20 and the second epitaxial layer 30. Thereby, unnecessary ion implantation is avoided; and unnecessary degradation of characteristics is prevented.

Here, because the defect suppression layer 40 of the semiconductor device 110 has lattice strain, there is a possibility that the properties of an ideal semiconductor material without lattice strain cannot be maintained. However, the junction interface of the semiconductor device 110 is the pn junction interface of the element interior. Therefore, it is considered that the relationship between the lattice strain provided in the defect suppression layer 40 which is the front surface portion of the semiconductor device 110 and the device characteristics such as the static characteristics, the dynamic characteristics, etc., is exceedingly weak. Accordingly, according to the structure of the semiconductor device 110, the on-voltage and the breakdown voltage are maintained for a long period of time without degradation of other characteristics.

Second Embodiment

A method for manufacturing a semiconductor device according to a second embodiment will now be described.

In the embodiment, a method for manufacturing a bipolar diode (a PiN diode) that uses SiC will be described.

Figure 3:
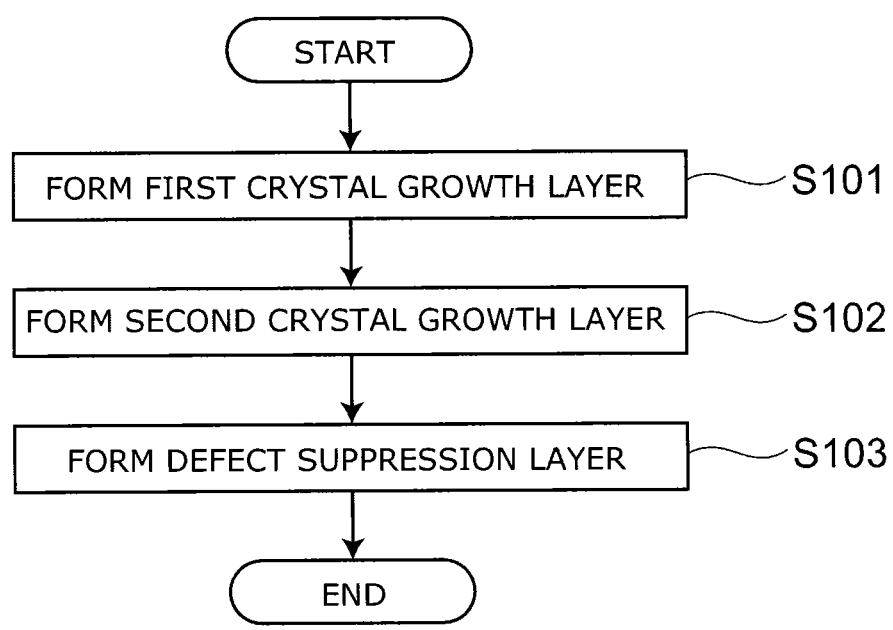
FIG. 3 is a flowchart showing a method for manufacturing the semiconductor device according to the embodiment.

FIG. 3 is a flowchart showing the method for manufacturing the semiconductor device according to the embodiment.

FIG. 4A to FIG. 5C are schematic cross-sectional views showing the method for manufacturing the semiconductor device according to the embodiment.

As shown in FIG. 3, the method for manufacturing the semiconductor device according to the embodiment includes forming a first epitaxial layer (step S101), forming a second epitaxial layer (step S102), and forming a defect suppression layer (step S103).

A specific example of the method for manufacturing the semiconductor device shown in FIG. 3 will now be described with reference to FIG. 4A to FIG. 5C.

Figure 4A:
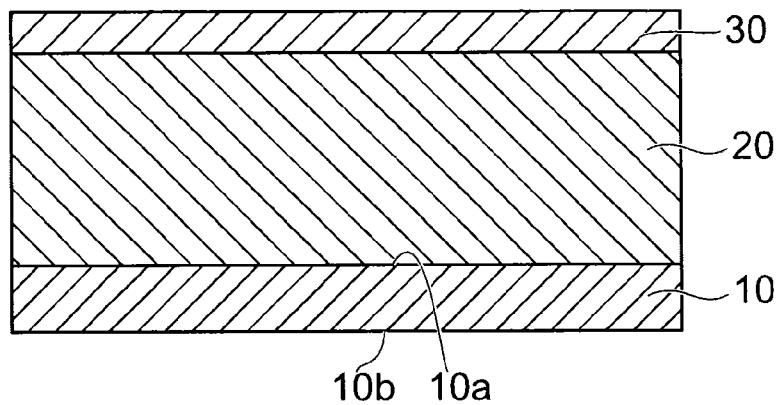
FIG. 4A to FIG. 5C are schematic cross-sectional views showing the method for manufacturing the semiconductor device according to the embodiment.

First, as shown in FIG. 4A, the SiC bulk substrate 10 made by sublimation, etc., is prepared. The doping concentration inside the substrate 10 is not less than about $1 \times 10^{18}$ cm$^{-3}$ and not more than about $1 \times 10^{20}$ cm$^{-3}$. In the embodiment, the case where the doping concentration of the substrate 10 is $5 \times 10^{18}$ cm$^{-3}$ is used as an example. The substrate 10 is an n$^+$ type.

Then, the n$^-$-type first epitaxial layer 20 is formed on the first surface 10a of the substrate 10. The first epitaxial layer 20 is formed on the first surface 10a by, for example, epitaxial growth. The doping concentration and thickness of the n$^-$-type first epitaxial layer 20 are designed according to the breakdown voltage and other characteristics of the element. For example, the doping concentration is not less than about $8 \times 10^{14}$ cm$^{-3}$ and not more than about $1 \times 10^{17}$ cm$^{-3}$; and the thickness is not less than about 5 μm and not more than about 200 μm. According to the doping concentration and thickness of the first epitaxial layer 20, a buffer layer (not shown) of the n conductivity type may be formed between the substrate 10 and the first epitaxial layer 20. The doping concentration of the buffer layer may be, for example, not less than about $5 \times 10^{17}$ cm$^{-3}$ and not more than about $5 \times 10^{18}$ cm$^{-3}$; and the thickness of the buffer layer may be from about several μm to about several tens of μm. The buffer layer may be formed on the first surface 10a of the substrate 10 by epitaxial growth.

Then, the p$^+$-type second epitaxial layer 30 is formed on the first epitaxial layer 20. The second epitaxial layer 30 is formed on the first epitaxial layer 20 by, for example, epitaxial growth. The second epitaxial layer 30 is formed using growth conditions matched to the target characteristics that control the spread of the depletion layer of the pn junction portion and reduce the contact resistance of the front surface portion. The doping concentration of the second epitaxial layer 30 is, for example, not less than $1 \times 10^{16}$ cm$^{-3}$ and not more than $5 \times 10^{19}$ cm$^{-3}$; and the thickness of the second epitaxial layer 30 is about several μm.

The doping concentration of the second epitaxial layer 30 may change in the thickness direction (the direction connecting the substrate 10 to the first epitaxial layer 20). For example, the doping concentration may be changed deliberately in the thickness direction by changing the conditions of the impurity concentration for the second epitaxial layer 30. In such a case, the doping concentration of the front surface portion (the shallow portion) of the second epitaxial layer 30 may be set to be high; and the doping concentration of the deep portion may be set to be low. By changing the doping concentration, the change of the impurity concentration of the second epitaxial layer 30 in the thickness direction may be in stages or continuous.

Figure 4B:
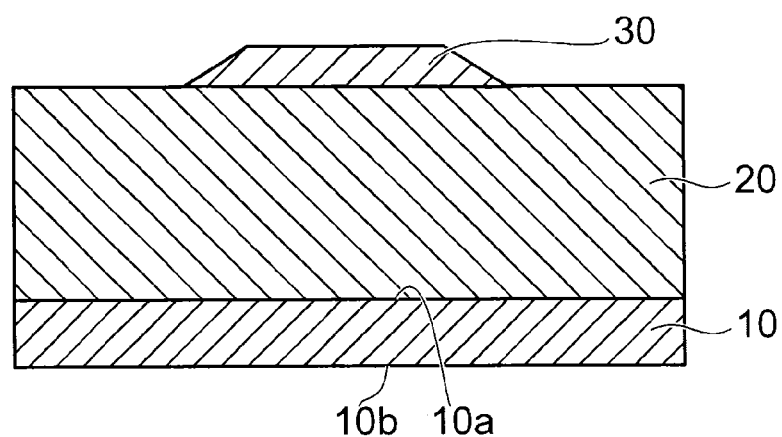

Then, as shown in FIG. 4B, an etching mask (not shown) is made at the central portion of the second epitaxial layer 30; and the second epitaxial layer 30 is patterned into a mesa shape. Ionic etching such as RIE (Reactive Ion Etching), etc., is applied to the patterning. In the RIE, for example, etching using a fluorine (F) or chlorine (Cl) gas is performed. The entire thickness of the second epitaxial layer 30 is etched at the portion of the second epitaxial layer 30 to be etched. Thereby, the n$^-$-type first epitaxial layer 20 is exposed at the peripheral portion of the second epitaxial layer 30 that remains without being etched.

In the case where the second epitaxial layer 30 is patterned into the mesa shape, the patterning is not limited to a mesa shape having one level; and the patterning conditions may be such that the second epitaxial layer 30 is patterned into multiple levels.

Figure 4C:
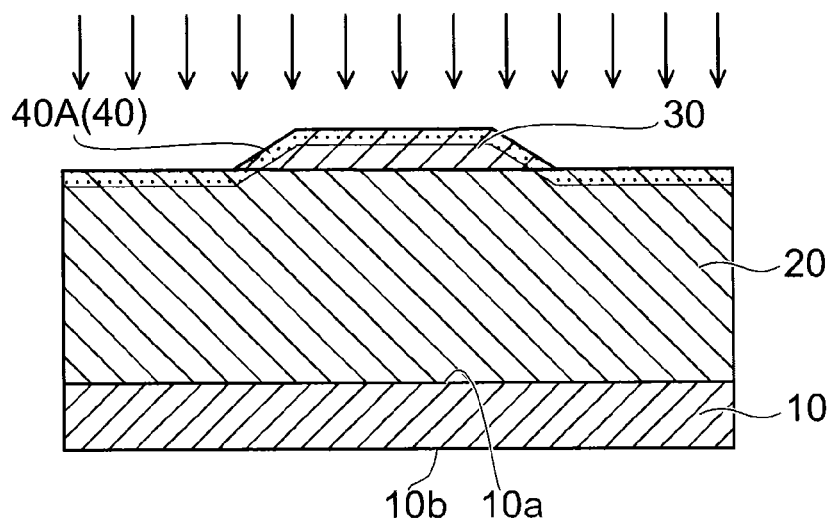

Then, as shown in FIG. 4C, ion implantation is performed for the entire front surface of the second epitaxial layer 30 and the first epitaxial layer 20. The ion species that is implanted may include, for example, inert ions. Ar, Si, C, etc., may be used as the ion species in the case where the second epitaxial layer 30 and the first epitaxial layer 20 are SiC. From the aspect of providing strain in the crystal, the implantation concentration is set to be a concentration that is higher than the host concentration by a factor of 1000 or more. The temperature when performing the ion implantation may be higher than room temperature. The depth of the ion implantation may be not less than 0.1 μm and not more than 0.5 μm.

From the aspect of providing the strain in the crystal, phosphorus (P) and aluminum (Al) which have relatively large atomic radii may be used as the ion species recited above. In such a case, considering the effects of the device characteristics due to the doping type and concentration, it is desirable to perform, for example, counter implantation. Thereby, both the formation of the strain and the adjustment of the carrier concentration can be realized by the high number of ions.

The ion species that is implanted may be singular or multiple. For example, an ion species that causes a large strain in the crystal may be implanted into the second epitaxial layer 30 that is patterned into the mesa shape; and an ion species that causes a small strain in the crystal may be implanted at the peripheral portion of the second epitaxial layer 30. In the case where there is a risk of autodoping, the defect suppression layer 40 may be formed after forming the JTE described below.

An ion implantation region 40A is formed at least on the second epitaxial layer 30 by the ion implantation. The ion implantation region 40A is the region that becomes the defect suppression layer 40 by subsequent activation annealing. As in the embodiment, the ion implantation region 40A is formed from the region on the second epitaxial layer 30 to a region on the first epitaxial layer 20 by performing ion implantation into the entire front surface of the second epitaxial layer 30 and the first epitaxial layer 20.

Figure 5A:
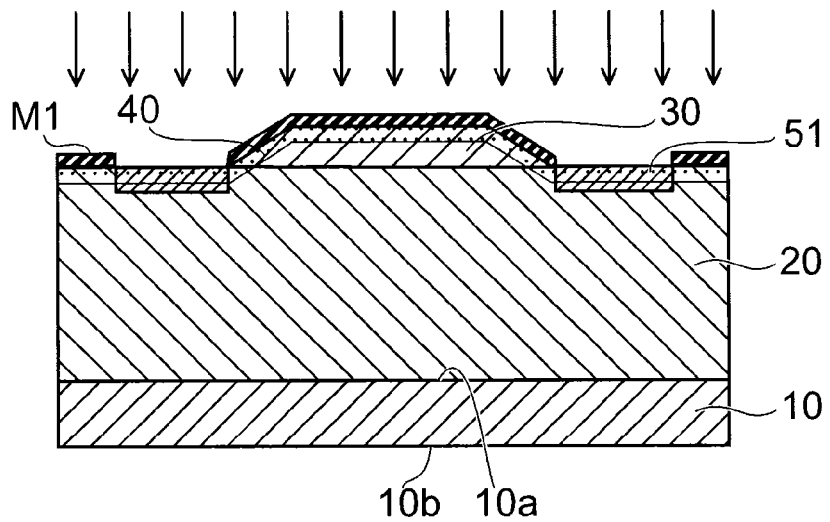

Then, as shown in FIG. 5A, the terminal structure region 51 is formed. For example, a p⁻-type JTE, a RESURF layer, or a guard ring layer may be used as the terminal structure region 51. In the embodiment, the p⁻-type JTE is formed. To form the terminal structure region 51, first, a mask M1 is formed of an insulating material or an organic material such as a resist, etc., that has openings; and ion implantation is performed via the openings. Here, the JTE is formed by ion implantation with, for example, an impurity concentration not less than $5\times10^{16}$ cm$^{-3}$ and not more than $5\times10^{18}$ cm$^{-3}$ and a thickness not less than about 0.3 μm and not more than about 0.5 μm. It is desirable for the JTE to be formed to be deeper than the thickness of the ion implantation region 40A formed previously. Thereby, the electric field concentration during the reverse voltage application does not occur easily.

Figure 5B:
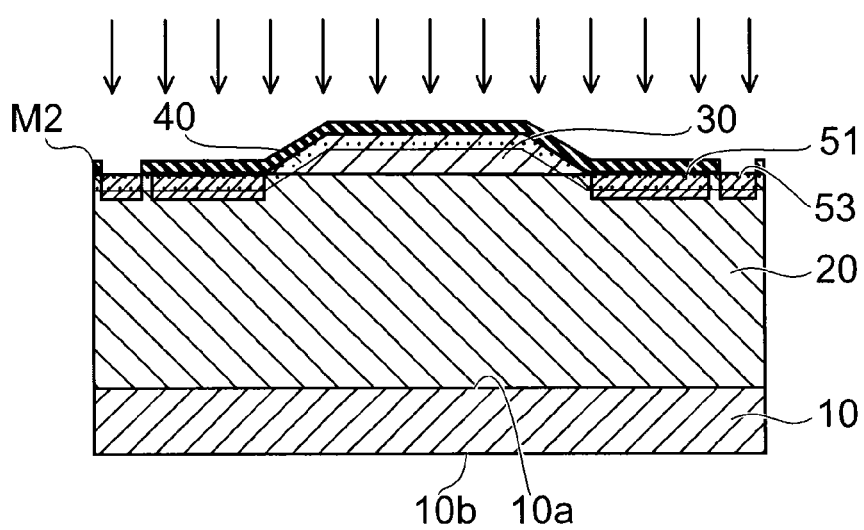

Continuing as shown in FIG. 5B, the channel stopper layer 53 is formed as a portion that prevents the spread of the potential to the end surface of the pn junction portion. Similarly to the formation of the terminal structure region 51, the channel stopper layer 53 is formed by forming a mask M2 having openings and performing ion implantation via the openings. Thereby, the channel stopper layer 53 is formed at the periphery of the terminal structure region 51. The channel stopper layer 53 is formed to be separated from the terminal structure region 51.

If necessary, ion implantation into the upper portion of the second epitaxial layer 30 may be performed to reduce the contact resistance. Then, after all of the ion implantation ends, activation annealing is performed. In such a case, the strain of the lattice positioned where the ion species is implanted also spreads to the periphery due to the particle arrangement that occurs for the large amount of the inert implantation species introduced to the front surface of the first epitaxial layer 20 and the second epitaxial layer 30. Thereby, a structure (the defect suppression layer 40) is formed such that stress is applied inside the basal plane.

Figure 5C:
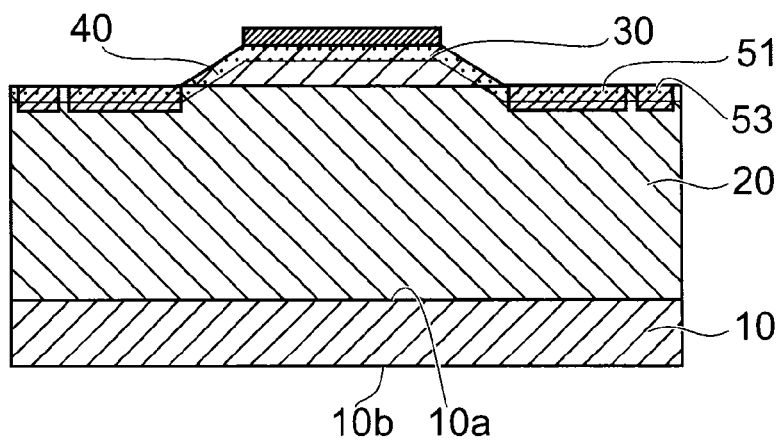

Then, as shown in FIG. 5C, the cathode electrode 70 is formed on the second major surface 10b of the substrate 10. Heat treatment of the cathode electrode 70 is performed if necessary. Subsequently, the anode electrode 80 is formed on the second epitaxial layer 30. Heat treatment of the anode electrode 80 is performed if necessary. Materials that can have low-resistance ohmic junctions with the semiconductor regions that contact the cathode electrode 70 and the anode electrode 80 are suitable as the material of the cathode electrode 70 and the material of the anode electrode 80.

If the semiconductor regions contacting the cathode electrode 70 and the anode electrode 80 are SiC and if there are no problems related to the heat treatment temperature of the cathode electrode 70 and the heat treatment temperature of the anode electrode 80, the cathode electrode 70 may be formed after the anode electrode 80 is formed. If necessary, an insulating film, an organic film, etc., may be formed around the substrate 10, the first epitaxial layer 20, the second epitaxial layer 30, the defect suppression layer 40, the terminal structure region 51, and the channel stopper layer 53 to perform the role of preventing discharge. Thereby, the semiconductor device 110 which includes the defect suppression layer 40 is completed.

Third Embodiment

A third embodiment will now be described.

Figure 6:
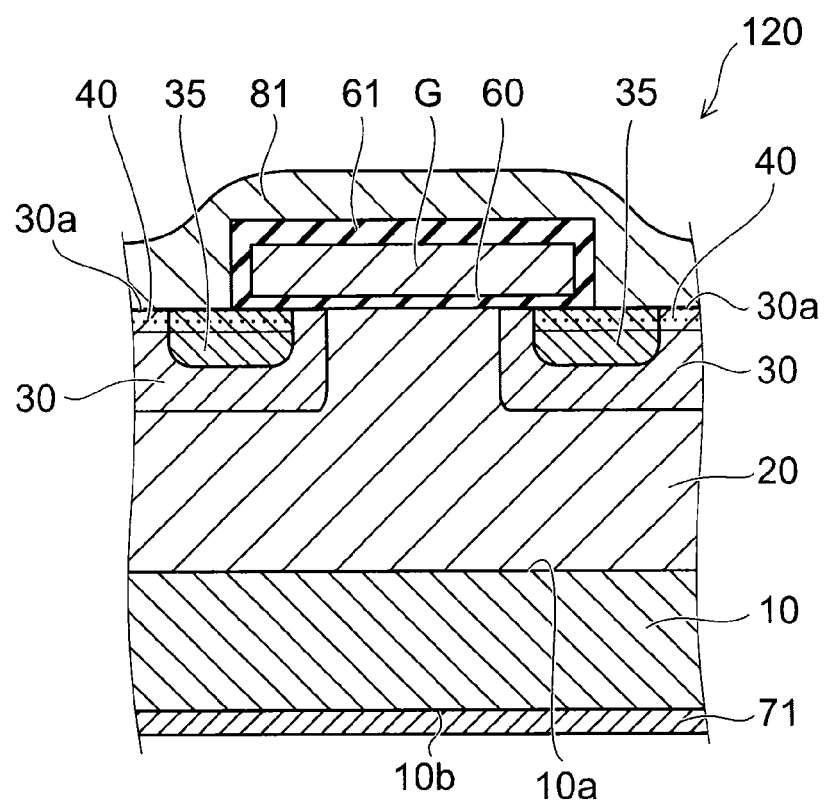
FIG. 6 is a schematic cross-sectional view showing a configuration of a semiconductor device according to a third embodiment.

FIG. 6 is a schematic cross-sectional view showing the configuration of a semiconductor device according to the third embodiment.

As shown in FIG. 6, the semiconductor device 120 according to the third embodiment includes the substrate 10 which is the first semiconductor region, the first epitaxial layer 20 which is the second semiconductor region, the second epitaxial layer 30 which is the third semiconductor region, the defect suppression layer 40 which is the fourth semiconductor region, a source region 35 which is a fifth semiconductor region, a gate insulating film 60, a gate electrode G, a drain electrode 71 which is a first electrode, and a source electrode 81 which is a second electrode.

In other words, the semiconductor device 120 is a MOSFET (Metal Oxide Semiconductor Field Effect Transistor).

The substrate 10 is, for example, an n⁺-type SIC bulk substrate. Similarly to the semiconductor device 110 according to the first embodiment, the substrate 10 is a misoriented substrate. The first epitaxial layer 20 is a semiconductor region including n⁻-type SiC. The first epitaxial layer 20 has a prescribed crystal structure formed on the first surface 10a of the substrate 10.

The second epitaxial layer 30 is a semiconductor region including p-type SiC. The second epitaxial layer 30 has a prescribed crystal structure formed on a portion of the first epitaxial layer 20. Multiple second epitaxial layers 30 are provided in the semiconductor device 120. The multiple second epitaxial layers 30 are disposed to be separated from each other on the first epitaxial layer 20.

The source region 35 is a semiconductor region including n⁺-type SiC. The source region 35 is formed on a portion of the second epitaxial layer 30. The source region 35 is formed by, for example, ion implantation into the second epitaxial layer 30. The region of the second epitaxial layer 30 between the source region 35 and the first epitaxial layer 20 on a front surface 30a side of the second epitaxial layer 30 is the region where a channel is formed in the on-operation. Multiple source regions 35 are provided in the semiconductor device 120. The multiple source regions 35 are provided respectively in the multiple second epitaxial layers 30.

The defect suppression layer 40 is provided at least on or in a portion of the second epitaxial layer 30. In the embodiment, the defect suppression layer 40 is provided in the portion of the second epitaxial layer 30 that contacts the source electrode 81. The defect suppression layer 40 may be further provided on or in a portion of the source region 35.

The gate insulating film 60 is provided at least on the front surface 30a of the second epitaxial layer 30. The gate electrode G is provided on the gate insulating film 60. An insulating film 61 is provided between the gate electrode G and the source electrode 81.

The source electrode 81 contacts the source region 35. The source electrode 81 has an ohmic contact with the source region 35. In the embodiment, the source electrode 81 also contacts the second epitaxial layer 30. Thereby, the source electrode 81 functions as a common electrode of the source region 35 and the second epitaxial layer 30 of the MOSFET.

The drain electrode 71 contacts the second major surface 10b of the substrate 10. The drain electrode 71 has an ohmic connection with the substrate 10.

Operations of the semiconductor device 120 will now be described.

An inversion layer (a channel) is formed in the second epitaxial layer 30 proximally to the interface between the second epitaxial layer 30 and the gate insulating film 60 when a voltage equal to or greater than the threshold is applied to the gate electrode G in the state in which a voltage that is positive with respect to the source electrode 81 is applied to the drain electrode 71. Thereby, the semiconductor device 120 is switched to the on-state; and a current flows from the drain electrode 71 into the source electrode 81.

On the other hand, the channel vanishes when the voltage applied to the gate electrode G is less than the threshold. Thereby, the semiconductor device 120 is switched to the off-state; and the current flowing from the drain electrode 71 into the source electrode 81 is broken.

In the semiconductor device 120 which is a MOSFET, a pn junction interface is formed between the first epitaxial layer 20 and the second epitaxial layer 30. The pn junction interface functions as the body diode of the MOSFET.

By providing the defect suppression layer 40 to a prescribed depth from the front surface 30a of the second epitaxial layer 30 in the semiconductor device 120, similarly to the semiconductor device 110 according to the first embodiment, the on-voltage and the breakdown voltage are maintained for a long period of time without degradation of other characteristics.

In the MOSFET, it is desirable to design the formation position of the defect suppression layer 40 by considering that the characteristics are affected by the impurities proximal to the gate insulating film 60 and particularly in the region where the channel is formed. For example, the defect suppression layer 40 is not provided in the region where the channel is formed.

Fourth Embodiment

A fourth embodiment will now be described.

Figure 7:
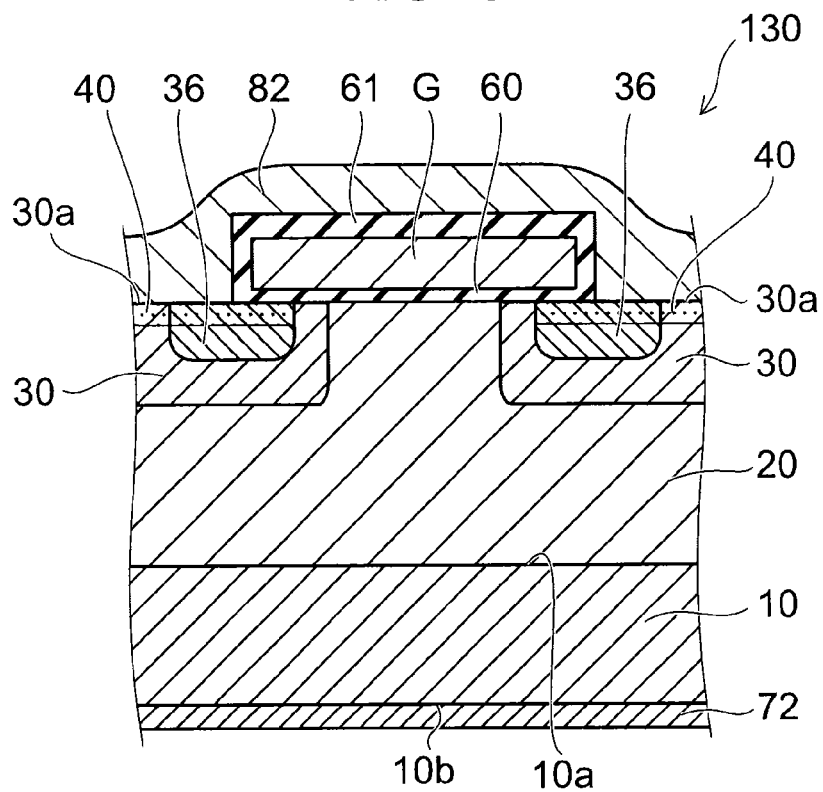
FIG. 7 is a schematic cross-sectional view showing a configuration of a semiconductor device according to a fourth embodiment.

FIG. 7 is a schematic cross-sectional view showing the configuration of a semiconductor device according to the fourth embodiment.

As shown in FIG. 7, the semiconductor device 130 according to the fourth embodiment includes the substrate 10 which is the first semiconductor region, the first epitaxial layer 20 which is the second semiconductor region, the second epitaxial layer 30 which is the third semiconductor region, the defect suppression layer 40 which is the fourth semiconductor region, an emitter region 36 which is the fifth semiconductor region, the gate insulating film 60, the gate electrode G, a collector electrode 72 which is the first electrode, and an emitter electrode 82 which is the second electrode.

In other words, the semiconductor device 130 is an IGBT (Insulated Gate Bipolar Transistor).

The semiconductor device 130 differs from the semiconductor device 120 in that the conductivity type of the substrate 10 is the $p^+$-type. In the semiconductor device 130, the substrate 10 is, for example, a $p^+$-type SiC bulk substrate. In the semiconductor device 130, the first epitaxial layer 20 is a semiconductor region including $n^-$-type SiC. The first epitaxial layer 20 is used as the drift layer of the IGBT.

In the semiconductor device 130, the second epitaxial layer 30 is a semiconductor region including $p^-$-type SiC. The second epitaxial layer 30 has a prescribed crystal structure formed on a portion of the first epitaxial layer 20. The second epitaxial layer 30 is used as the base region of the IGBT. Multiple second epitaxial layers 30 are provided in the semiconductor device 130. The multiple second epitaxial layers 30 are disposed to be separated from each other on the first epitaxial layer 20.

The emitter region 36 is a semiconductor region including $n^+$-type SiC. The emitter region 36 corresponds to the source region 35 of the semiconductor device 120. Multiple emitter regions 36 are provided in the semiconductor device 130. The multiple emitter regions 36 are provided respectively in the multiple second epitaxial layers 30.

The defect suppression layer 40 is provided at least on or in a portion of the second epitaxial layer 30. In the embodiment, the defect suppression layer 40 is provided in a portion of the second epitaxial layer 30 that contacts the source electrode 81. The defect suppression layer 40 may be further provided on or in a portion of the emitter region 36.

The gate insulating film 60 is provided at least on the front surface 30a of the second epitaxial layers 30. The gate electrode G is provided on the gate insulating film 60. The gate electrode G is provided on two mutually-adjacent second epitaxial layers 30 with the gate insulating film 60 interposed. The insulating film 61 is provided between the gate electrode G and the emitter electrode 82.

The emitter electrode 82 contacts the emitter region 36. The emitter electrode 82 has an ohmic connection with the emitter region 36. In the embodiment, the emitter electrode 82 also contacts the second epitaxial layer 30. Thereby, the emitter electrode 82 functions as a common electrode of the emitter region 36 and the second epitaxial layer 30 of the IGBT.

The collector electrode 72 contacts the second major surface 10b of the substrate 10. The collector electrode 72 has an ohmic connection with the substrate 10.

Operations of the semiconductor device 130 will now be described.

When a voltage equal to or greater than the threshold is applied to the gate electrode G in the state in which a voltage that is positive with respect to the emitter electrode 82 is applied to the collector electrode 72, an inversion layer (a channel) is formed in the second epitaxial layer 30 which is the base region proximally to the interface between the second epitaxial layer 30 and the gate insulating film 60. Thereby, electrons are injected from the emitter region 36 into the second epitaxial layer 30 (the base region) via the channel; and the state is switched to the on-state. Also at this time, holes are injected from the collector electrode 72 into the first epitaxial layer 20 (the drift region). The holes injected into the drift region flow through the base region into the emitter electrode 82. In the on-state of the semiconductor device 130, the holes from the collector electrode 72 are injected into the drift region; conductivity modulation occurs; and the resistance of the drift region decreases.

On the other hand, the channel vanishes when the voltage applied to the gate electrode G is less than the threshold. Thereby, the semiconductor device 130 is switched to the off-state; and the current flowing from the collector electrode 72 into the emitter electrode 82 is broken.

Because the operation of the semiconductor device 130 which is an IGBT has a bipolar mode, similarly to the semiconductor device 110 according to the first embodiment, the occurrence of the stacking faults having the basal plane dislocations as starting points is suppressed. Accordingly, the occurrence of the stacking faults in the semiconductor device 130 which includes the defect suppression layer 40 is suppressed; and the on-voltage and the breakdown voltage are maintained for a long period of time without degradation of other characteristics.

In the IGBT as well, similarly to the MOSFET, it is desirable to design the formation position of the defect suppression layer 40 by considering that the characteristics are affected by the impurities proximal to the gate insulating film 60 and particularly in the region where the channel is formed. For example, the defect suppression layer 40 is not provided in the region where the channel is formed.

Fifth Embodiment

A fifth embodiment will now be described.

Figure 8:
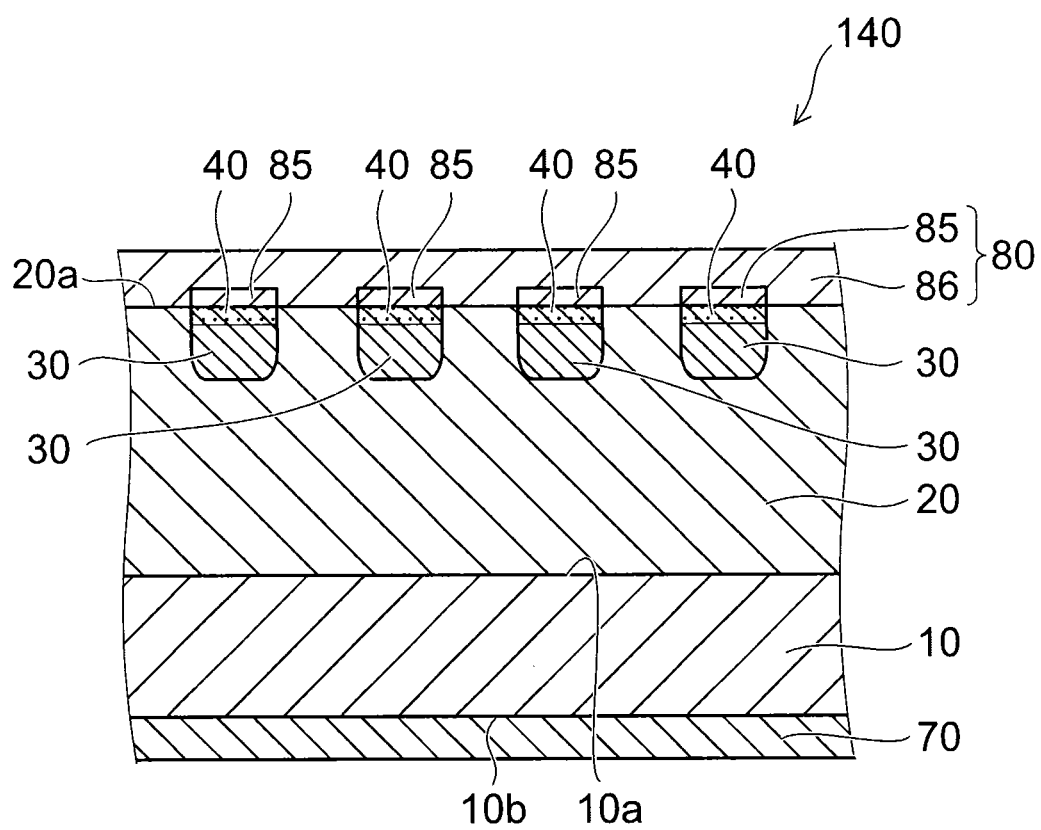
FIG. 8 is a schematic cross-sectional view showing a configuration of a semiconductor device according to a fifth embodiment.

FIG. 8 is a schematic cross-sectional view showing the configuration of a semiconductor device according to the fifth embodiment.

As shown in FIG. 8, the semiconductor device 140 according to the fifth embodiment includes the substrate 10 which is the first semiconductor region, the first epitaxial layer 20 which is the second semiconductor region, the second epitaxial layer 30 which is the third semiconductor region, the defect suppression layer 40 which is the fourth semiconductor region, the cathode electrode 70 which is the first electrode, and the anode electrode 80 which is the second electrode.

In other words, the semiconductor device 140 is a MPS (Merged PiN Schottky) diode.

The substrate 10 is, for example, an $n^+$-type SiC bulk substrate. Similarly to the semiconductor device 110 according to the first embodiment, the substrate 10 is a misoriented substrate. The first epitaxial layer 20 is a semiconductor region including $n^-$-type SiC. The first epitaxial layer 20 has a prescribed crystal structure formed on the first surface 10a of the substrate 10.

The second epitaxial layer 30 is a semiconductor region including p-type SiC. The second epitaxial layer 30 has a prescribed crystal structure formed on a portion of the first epitaxial layer 20. The second epitaxial layer 30 is multiply provided on a front surface 20a side of the first epitaxial layer 20 at a prescribed spacing.

The anode electrode 80 includes ohmic electrodes 85 and a Schottky electrode 86. The ohmic electrodes 85 are provided on the second epitaxial layers 30. The ohmic electrodes 85 have ohmic connections with the second epitaxial layers 30.

The Schottky electrode 86 is provided on the ohmic electrodes 85 and covers the front surface 20a of the first epitaxial layer 20. The Schottky electrode 86 has a Schottky contact with the first epitaxial layer 20.

The cathode electrode 70 contacts the second major surface 10b of the substrate 10. The cathode electrode 70 has an ohmic connection with the substrate 10.

The defect suppression layer 40 is provided at least on or in a portion of the second epitaxial layers 30. In the embodiment, the defect suppression layer 40 is provided in portions of the second epitaxial layer 30 that contact the ohmic electrodes 85. The defect suppression layer 40 may be provided from the portions of the second epitaxial layers 30 contacting the ohmic electrodes 85 to a region on the front surface 20a of the first epitaxial layer 20 if there are no problems relating to the characteristics.

Operations of the semiconductor device 140 will now be described.

First, an operation of the semiconductor device 140 will be described in the case where a voltage (a forward voltage) is applied such that the anode electrode 80 is positive with respect to the cathode electrode 70. In the case where the forward voltage is applied, electrons that exceed the energy barrier flow from the first epitaxial layer 20 into the Schottky electrode 86 (the anode electrode 80). The electrons and the holes that exceed the built-in potential flow via the pn junction surfaces existing at the interface between the $p^+$-type second epitaxial layers 30 and the $n^-$-type first epitaxial layer 20. Thereby, the current flows in the semiconductor device 140 (the forward operation).

An operation of the semiconductor device 140 will now be described in the case where a voltage (a reverse voltage) is applied such that the anode electrode 80 is negative with respect to the cathode electrode 70. In the case where the reverse voltage is applied, a depletion layer spreads on the first epitaxial layer 20 side of the interface between the Schottky electrode 86 and the first epitaxial layer 20. The depletion layer spreads mainly on the i layer side of the pn junction surface. Thereby, substantially no current flows in the semiconductor device 140 (the reverse operation).

The semiconductor device 140 which is a MPS diode has both the characteristics of a Schottky barrier diode and the characteristics of a PiN diode. Namely, the semiconductor device 140 has a low on-voltage and excellent recovery characteristics.

Because the operation of the semiconductor device 130 which is a MPS diode has a bipolar mode, similarly to the semiconductor device 110 according to the first embodiment, the occurrence of the stacking faults having the basal plane dislocations as starting points is suppressed. Accordingly, the occurrence of the stacking faults in the semiconductor device 140 which includes the defect suppression layer 40 is suppressed; and the on-voltage and the breakdown voltage are maintained for a long period of time without degradation of other characteristics.

As described above, according to the semiconductor device and the method for manufacturing the semiconductor device according to the embodiments, the long-term reliability of the semiconductor device can be increased.

Although the embodiments and modifications thereof are described above, the invention is not limited to these examples. For example, additions, deletions, or design modifications of components or appropriate combinations of the features of the embodiments appropriately made by one skilled in the art in regard to the embodiments and modifications thereof described above are within the scope of the invention to the extent that the spirit of the invention is included.

For example, although the first conductivity type is the n type and the second conductivity type is the p type in the description of the embodiments and modifications thereof described above, the invention is practicable also in the case where the first conductivity type is the p type and the second conductivity type is the n type. The embodiments and the modifications described above are applicable to devices on either the Si surface or the C surface.

Although the case is illustrated in the embodiments described above where SiC is applied as the substrate 10, the first epitaxial layer 20, and the second epitaxial layer 30, the materials of these components are not limited to SiC; and the embodiments are applicable also to materials that include crystal defects and stacking faults that propagate from the basal plane.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a first electrode;
    a first semiconductor region of a first conductivity type, the first semiconductor region being provided on the first electrode and electrically connected with the first electrode;
    a second semiconductor region provided on the first semiconductor region, an impurity concentration of the second semiconductor region being lower than an impurity concentration of the first semiconductor region, the second semiconductor region including a first part region;
    a third semiconductor region of a second conductivity type, the third semiconductor region being provided on the first part region; and
    a fourth semiconductor region provided on the third semiconductor region, a lattice strain of the fourth semiconductor region being greater than a lattice strain of the third semiconductor region,
    wherein a part of the fourth semiconductor region is disposed between a second electrode and the third semiconductor region, another part of the fourth semiconductor region is disposed in a portion of a fifth semiconductor region, the part of the fourth semiconductor region being apart from an interface between the third semiconductor region and the second semiconductor region,
    the second electrode being electrically connected with the third semiconductor region through the part of the fourth semiconductor region,
    and the second electrode being further electrically connected with the fifth semiconductor region, and
    the fifth semiconductor region provided on the third semiconductor region, the portion of the fifth semiconductor region being apart from an interface between the third semiconductor region and the second semiconductor region.

2. The device according to claim 1, wherein the second semiconductor region and the third semiconductor region have crystal structures formed by epitaxial growth.

3. The device according to claim 1, wherein the fourth semiconductor region includes an impurity different from an impurity included in the third semiconductor region.

4. The device according to claim 3, wherein the impurity included in the fourth semiconductor region includes an inert element.

5. The device according to claim 4, wherein the impurity is at least one selected from Ar, Si, and C.

6. The device according to claim 1, wherein an impurity concentration of the fourth semiconductor region is higher than an impurity concentration of the third semiconductor region.

7. The device according to claim 1, wherein
    the impurity concentration of the second semiconductor region is not less than $8 \times 10^{14}$ cm-3 and not more than $1 \times 10^{17}$ cm-3,
    an impurity concentration of the third semiconductor region is not less than $1 \times 10^{16}$ cm-3 and not more than $5 \times 10^{19}$ cm-3, and
    an impurity concentration of the fourth semiconductor region is not less than $5 \times 10^{17}$ cm-3 and not more than $1 \times 10^{21}$ cm-3.

8. The device according to claim 1, wherein the first semiconductor region, the second semiconductor region, the third semiconductor region, and the fourth semiconductor region include silicon carbide.

9. The device according to claim 1, wherein
    the first semiconductor region is a substrate having a first surface and including hexagonal silicon carbide, and
    the first surface of the substrate is tilted more than 0 degrees and not more than 8 degrees with respect to a basal plane of the silicon carbide.

10. The device according to claim 9, wherein the substrate includes 4H—SiC.

11. The device according to claim 1, wherein
    a current flows from the second electrode toward the first electrode when a voltage is applied to the second electrode, the voltage being positive with respect to the first electrode.

12. The device according to claim 1, further comprising a terminal structure region of the second conductivity type provided on the second semiconductor region around the third semiconductor region, an impurity concentration of the terminal structure region being lower than an impurity concentration of the third semiconductor region.

13. The device according to claim 12, further comprising a channel stopper layer of the second conductivity type provided on the second semiconductor region around the terminal structure region and separated from the terminal structure region, an impurity concentration of the channel stopper layer being lower than an impurity concentration of the third semiconductor region.

14. The device according to claim 1, wherein
    the second semiconductor region further including a second part region, the second part region being arranged with the first part region in a first direction crossing a second direction from the first electrode toward the second electrode,
    the fifth semiconductor region being provided on the second part region,
    a lattice strain of the fifth semiconductor region being greater than the lattice strain of the third semiconductor region.

15. The device according to claim 1, wherein the part of the fourth semiconductor region is disposed above the third semiconductor region.

* * * * *